(12) United States Patent
Won et al.

(10) Patent No.: US 6,844,610 B2
(45) Date of Patent: Jan. 18, 2005

(54) INTEGRATED CIRCUIT DEVICES INCLUDING A RESISTOR PATTERN

(75) Inventors: Seok-Jun Won, Seoul (KR); Young-Wook Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/672,497

(22) Filed: Sep. 25, 2003

(65) Prior Publication Data

US 2004/0056755 A1 Mar. 25, 2004

Related U.S. Application Data

(62) Division of application No. 10/051,908, filed on Jan. 17, 2002, now Pat. No. 6,653,155.

(30) Foreign Application Priority Data

Mar. 26, 2001 (KR) ........................................ 2001-15717

(51) Int. Cl.[7] ............................................... H01L 29/00
(52) U.S. Cl. ........................ 257/538; 257/537; 257/536; 257/380
(58) Field of Search ................................ 257/350, 358, 257/359, 360, 363, 379, 380, 381, 536, 537, 538

(56) References Cited

U.S. PATENT DOCUMENTS 6,083,785 A * 7/2000 Segawa et al. ............. 438/238
6,696,733 B2 * 2/2004 Koike et al. ................ 257/379

* cited by examiner

*Primary Examiner*—Amir Zarabian
*Assistant Examiner*—Christy Novacek
(74) *Attorney, Agent, or Firm*—Myers Bigel Sibley & Sajovec

(57) ABSTRACT

Methods are provided for forming an integrated circuit device including a resistor pattern having a desired resistance value. A low resistive layer is formed on an integrated circuit substrate. An insulating layer is formed on the low resistive layer opposite the integrated circuit substrate. A high resistive layer, which may have a specific resistance of at least about a hundred $\mu\Omega \cdot cm$, is formed on the insulating layer opposite the low resistive layer. The low resistive layer, the insulating layer and the high resistive layer define the resistor pattern in a region of the integrated circuit substrate. Integrated circuit devices including resistor patterns as provided by the methods are also provided and methods for forming metal contacts to the resistor pattern are also provided.

15 Claims, 6 Drawing Sheets

INTEGRATED CIRCUIT DEVICES INCLUDING A RESISTOR PATTERN

RELATED APPLICATIONS

This application claims priority to and is a divisional of parent application number 10/051,908, filed Jan. 17, 2002 now U.S. Pat. No. 6,653,155, which claims the benefit of Korean Patent Application No. 2001-15717, filed Mar. 26, 2001, the disclosures of which are hereby incorporated herein by reference.

BACKGROUND OF THE INVENTION

The present invention relates to integrated circuit devices and methods for manufacturing the same.

Various integrated circuit devices, including semiconductor memory devices such as DRAMs, include a resistor pattern. For example, a resistor pattern may be provided having a resistance chosen to control a signal transmission characteristic of the integrated circuit device. The resistor pattern may be formed, for example, using a polysilicon layer having a specific resistance of thousands of microohms ($\mu\Omega$) per centimeter (cm) ($\mu\Omega\cdot$cm).

The resistor pattern for a semiconductor memory device, such as a DRAM, may be formed in a circuit including a capacitor. The resistor pattern may be formed by patterning an upper capacitor electrode material layer and a doped polysilicon layer, which are sequentially stacked on a substrate of the device, using a single mask before a metal conductive line is formed. Such an approach may be used as it is generally relatively easy to control a thickness of the polysilicon layer to control the resistance value of the resistor pattern. Furthermore, the resistor pattern is typically formed after a high temperature heating process that also may affect the resistance value of the resistor pattern.

However, a problem may arise where the upper capacitor electrode is a low resistance material, such as a material having a specific resistance of several $\mu\Omega\cdot$cm up to hundreds of $\mu\Omega\cdot$cm. Examples of such materials include ruthenium (Ru), platinum (Pt), and the like. Where such a material is present, its low resistivity characteristics may limit the ability to provide a desired resistance value for the resistor pattern. To form a resistor pattern having a desired resistance value, the resistor pattern may have to be formed with a relatively thin thickness or with a relatively long length to provide a desired resistance given the low specific resistance of the material. Therefore, it is generally not possible to simultaneously form such an upper capacitor electrode and a polysilicon layer providing sufficient resistance.

Figure 1:
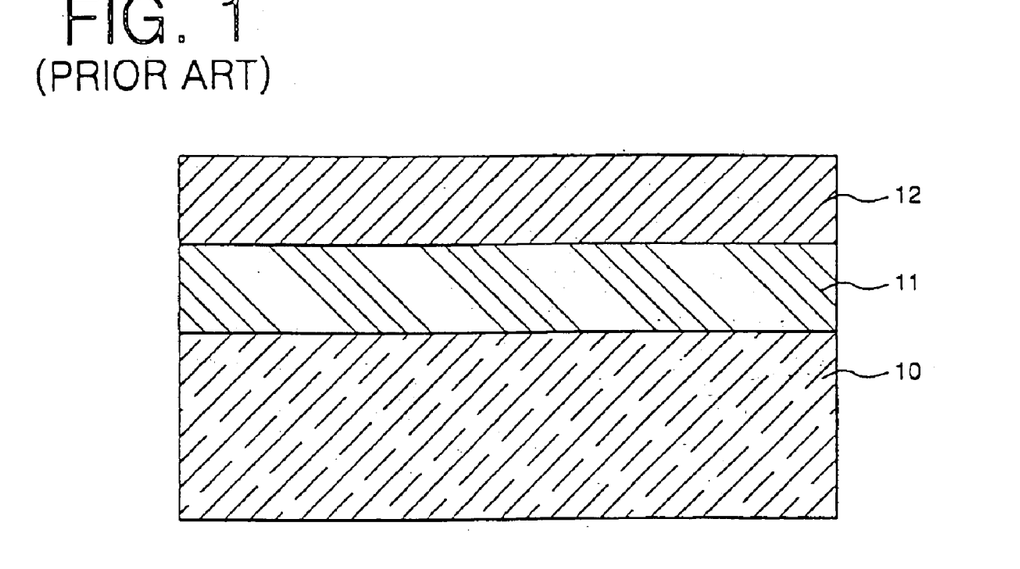
FIG. 1 is a cross-sectional schematic view illustrating a resistor pattern for use in an integrated circuit (semiconductor) device according to the prior art.

An example of a resistor pattern for use in a conventional semiconductor memory device will now be described with reference to the cross-sectional view of FIG. 1. As shown in FIG. 1, an upper capacitor electrode 11, having a relatively low resistance value, is formed on a semiconductor substrate 10. A doped polysilicon layer 12 is formed on the other side of the upper capacitor electrode 11. The polysilicon layer 12 can have a structure including a barrier metal of, for example, titanium nitride (TiN). As discussed above, the upper capacitor electrode 11 may be, for example, Ru or Pt. Thus, the resistor pattern in such a configuration may have the following structure: Ru/polysilicon, Pt/polysilicon, Ru/TiN/polysilcon, and/or Pt/TiN/polysilicon.

In such a conventional resistor pattern, because the doped polysilicon layer 12 is formed on an upper capacitor electrode 11 that has a relatively low resistance value (compared to the doped polysilicon layer 12), an electrical current passing through the resistor pattern may substantially flow to the upper capacitor electrode 11 because of its relatively low resistance value. Thus, the ability to increase the resistance value of the resistor pattern based on the resisistivity of the higher resistance value polysilicon layer 12 may be very limited. To avoid this problem, the doped polysilicon layer is generally not formed using the same mask as used to form the lower resistivity upper capacitor electrode 11.

SUMMARY OF THE INVENTION

Embodiments of the present invention include methods for forming an integrated circuit device including a resistor pattern having a desired resistance value. A low resistive layer is formed on an integrated circuit substrate. An insulating layer is formed on the low resistive layer opposite the integrated circuit substrate. A high resistive layer, which may have a specific resistance of at least about a hundred $\mu\Omega\cdot$cm, is formed on the insulating layer opposite the low resistive layer. The low resistive layer, the insulating layer and the high resistive layer define the resistor pattern in a region of the integrated circuit substrate.

In other embodiments of the present invention, the integrated circuit device is an integrated circuit memory device including a capacitor and wherein the step of forming a low resistive layer comprises concurrently forming the low resistive layer defining the resistor pattern in the region of the integrated circuit substrate and forming an upper capacitor electrode of the capacitor in a different region of the integrated circuit substrate, wherein the low resistive layer defining the resistor pattern and the upper capacitor electrode are formed of the same material.

The low resistive layer may be at least one of ruthenium (Ru), platinum (Pt), $RuO_2$, Ir, $IrO_2$, W, aluminum (Al), Cu, titanium nitride (TiN), tantalum nitride (TaN) and/or WN and the high resistive layer may be a doped polysilicon. The insulating layer may be at least one of $SiO_2$, $Ta_2O_5$, $Al_2O_3$ and/or $Si_3N_4$.

In further embodiments of the present invention, at least one of a source and/or a drain is formed in a cell region of the integrated circuit memory device between the region of the integrated circuit substrate including the resistor pattern and the different region of the integrated circuit substrate including the capacitor. A first metal contact, having a first depth, may be formed to the upper capacitor electrode and a second metal contact, having a second depth different from the first depth, may be formed to the high resistive layer of the resistor pattern. A titanium nitride (TiN) layer may be formed between the low resistive layer and the insulating layer.

In other embodiments of the present invention, methods are provided for forming an integrated circuit device including a resistor pattern having a desired resistance value. An integrated surface substrate is provided and a low resistive layer is formed defining an upper capacitor electrode in a first region of the integrated circuit substrate and a low resistive layer of the resistor pattern in a second region of the integrated circuit substrate displaced from the first region. An insulating layer is formed on the upper capacitor electrode and on the low resistive layer of the resistor pattern opposite the integrated circuit substrate. A high resistive layer is formed on the insulating layer on the upper capacitor electrode and on the low resistive layer of the resistor pattern opposite the low resistive layer. The low resistive layer, the insulating layer and the high resistive layer are formed through a single photolithography process using a common mask.

The high resistive layer may have a specific resistance of at least about a hundred μΩ•cm. A metal contact may be formed to the upper capacitor electrode and a metal contact may be formed to the high resistive layer of the resistor pattern using a two photo mask process. The integrated circuit device may be an integrated circuit memory device having a junction region and the two photo mask process may further include forming a metal contact to the junction region.

In further embodiments of the present invention, the steps of forming the low resistive layer, the insulating layer and the high resistive layer may include depositing the low resistive layer over the entire surface of at least a portion of the integrated circuit substrate including the first region and the second region. The insulating layer may be deposited on the low resistive layer and the high resistive layer deposited on the insulating layer. The low resistive layer, the insulating layer and the high resistive layer may then be patterned to form the upper capacitor electrode in the first region and the resistor pattern in the second region of the integrated circuit substrate. The integrated circuit device may be an integrated circuit memory device and the first region may be a cell region of the integrated circuit memory device and the second region may be a periphery region of the integrated circuit memory device.

In other embodiments of the present invention, resistor patterns are provided for an integrated circuit memory device having a capacitor. The resistor patterns include an integrated circuit substrate and a low resistive layer formed on the integrated circuit substrate. The low resistive layer defines an upper capacitor electrode of the capacitor and a low resistive layer of the resistor pattern in a region of the integrated circuit substrate displaced from the upper capacitor electrode. An insulating layer is formed on the upper capacitor electrode and the low resistive layer of the resistor pattern. A high resistive layer is formed on the insulating layer. The low resistive layer, the insulating layer and the high resistive layer define the resistor pattern in the region of the integrated circuit substrate displaced from the upper capacitor electrode. In various embodiments, the high resistive layer has a specific resistance of at least a hundred μΩ•cm or of at least a thousand μΩ•cm. The high resistive layer may be a doped polysilicon layer.

In further embodiments of the present invention, methods are provided of forming a resistor pattern in a semiconductor memory device having a capacitor. An integrated circuit substrate is provided including a cell region and a periphery region, the cell region including a first cell region and a second cell region. A low resistive material layer is deposited over all of a region of the semiconductor substrate including the cell region and the periphery region. An insulating material layer is deposited on the low resistive material layer and a high resistive material layer is deposited on the insulating layer. The low resistive material layer, the insulating material layer and the high resistive material layer are patterned to form a low resistive layer, an insulating layer and a high resistive layer, respectively, over the first cell region and the periphery region of the integrated circuit substrate. A TiN layer may also be deposited on the low resistive layer and an under insulating layer may be formed on the entire surface of the integrated circuit substrate.

In yet further embodiments of the present invention, methods of forming metal contacts of a resistor pattern for use in an integrated circuit memory device having a capacitor are provided. An integrated circuit substrate is provided. The integrated circuit substrate includes a cell region and a periphery region. The cell region includes a first cell region and a second cell region. The first cell region includes a first low resistive layer, a first insulating layer and a first high resistive layer that are sequentially stacked. The second cell region includes a conductive layer. The periphery region includes the resistor pattern. The resistor pattern includes a second low resistive layer, a second insulating layer and a second high resistive layer that are sequentially stacked. A planarization layer is formed over all of a surface of the integrated circuit substrate in at least a region including the cell region and the periphery region. First to third metal contacts are formed. The first metal contact is formed in the first cell region and exposes a portion of the first low resistive layer. The second metal contact is formed in the second cell region and exposes a portion of the conductive layer. The third metal contact is formed in the periphery region and exposes a portion of the second high resistive layer. The first metal contact may be formed using a first mask and the second metal contact and the third metal contact may be formed using a second mask. In alternative embodiments, the first metal contact and the second metal contact may be formed using a first mask and the third metal contact may be formed using a second mask.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Terms used herein are to be given their ordinary meaning unless explicitly defined otherwise herein.

Figure 2:
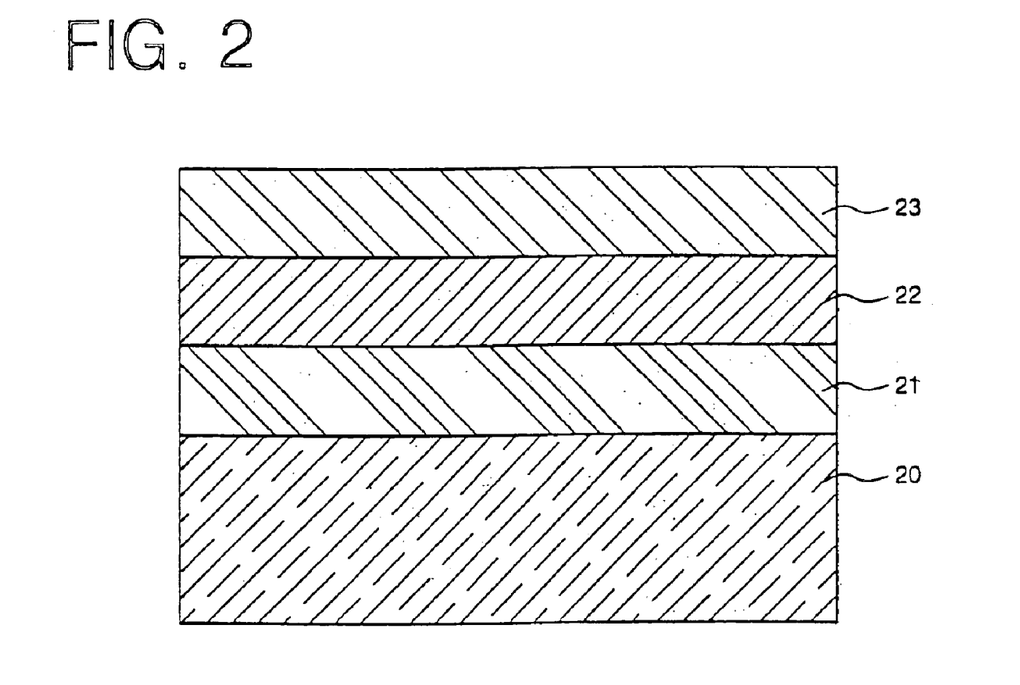
FIG. 2 is a cross-sectional schematic view illustrating a resistor pattern according to embodiments of the present invention.

Methods for forming an integrated circuit device including a resistor pattern having a desired resistance value in accordance with embodiments of the present invention will now be described with reference to FIGS. 2–5. FIG. 2 is a cross-sectional schematic view illustrating a resistor pattern according to the embodiments of the present invention. As shown in FIG. 2, the resistor pattern includes a low resistive layer 21 (compared to layer 23), formed by depositing a low resistive material on an integrated circuit (semiconductor) substrate 20, an insulating layer 22 formed on the low resistive layer 21, and a high resistive layer 23 (compared to the layer 21) formed on the insulating layer 22.

Figure 3A:
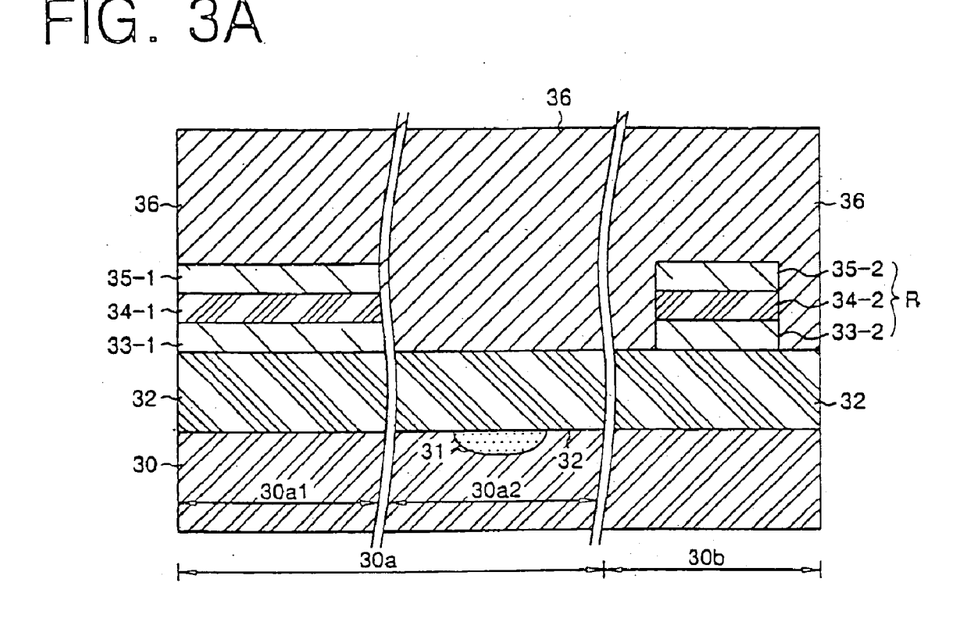
FIGS. 3A to 3D are cross-sectional schematic views illustrating methods for forming a metal contact of an integrated circuit memory device having a resistor pattern according to embodiments of the present invention.

By way of example, for an integrated circuit memory device as illustrated, for example, in FIG. 3A, the low resistive layer 21 may serve as an upper capacitor electrode formed from a low resistive material having a specific resistance of several to hundreds of $\mu\Omega$•cm, more particularly, preferably less than one hundred $\mu\Omega$•cm. Examples of such material include, but are not limited to, materials such as ruthenium (Ru), platinum (Pt), ruthenium oxide ($RuO_2$), iridium (Ir), iridium oxide ($IrO_2$), tungsten (W), aluminum (Al), copper (Cu), titanium nitride (TiN), tantalum nitride (TaN) and/or tungsten nitride (WN). The insulating layer 22 may be made of one or more of a variety of insulating materials including, but not limited to, $SiO_2$, $Ta_2O_5$, $Al_2O_3$, or $Si_3N_4$. The high resistive layer 23, in various embodiments, is a doped polysilicon. The doped polysilicon may have a specific resistance of at least a hundred $\mu\Omega$•cm or, in other embodiments of at least one hundred $\mu\Omega$•cm. The low resistive layer 21, the insulating layer 22 and the high resistive layer 23 can have a single- or a multi-layered structure.

A method of forming the resistor pattern having such a structure will now be further described. The low resistive layer 21, the insulating layer 22 and the high resistive layer 23 are sequentially deposited over the entire surface of at least a portion of the integrated circuit substrate 20 including the region including the resistor pattern and an upper capacitor electrode of the integrated circuit device. While not described herein, it will be understood by those of skill in the art that a corresponding lower capacitor electrode and a dielectric layer are previously formed on the integrated circuit substrate.

The low resistive layer 21, the insulating layer 22 and the high resistive layer 23 are, preferably, simultaneously (for both the upper capacitor electrode and the resistor pattern) patterned using a mask to form the upper capacitor electrode. Thus, the upper capacitor electrode (i.e., low resistive layer), the insulating layer and the high resistive layer are formed on a cell region including the capacitor and on a periphery region of the integrated circuit substrate, where the low resistive layer defines part of the structure of the resistor pattern, respectively. As a result, the resistor pattern may be formed in the periphery region at the same time as the upper capacitor electrode is formed over the cell region.

The insulating layer 22 limits or blocks electrical current from flowing to the low resistive layer 21 from the high resistive layer 23. As a result, the current flows primarily along the high resistive layer 23 and the effective resistance may be predominantly determined based on the resistance of the high resistive layer 23. This may facilitate providing a resistor pattern having a relatively high desired resistance value.

Figure 5:
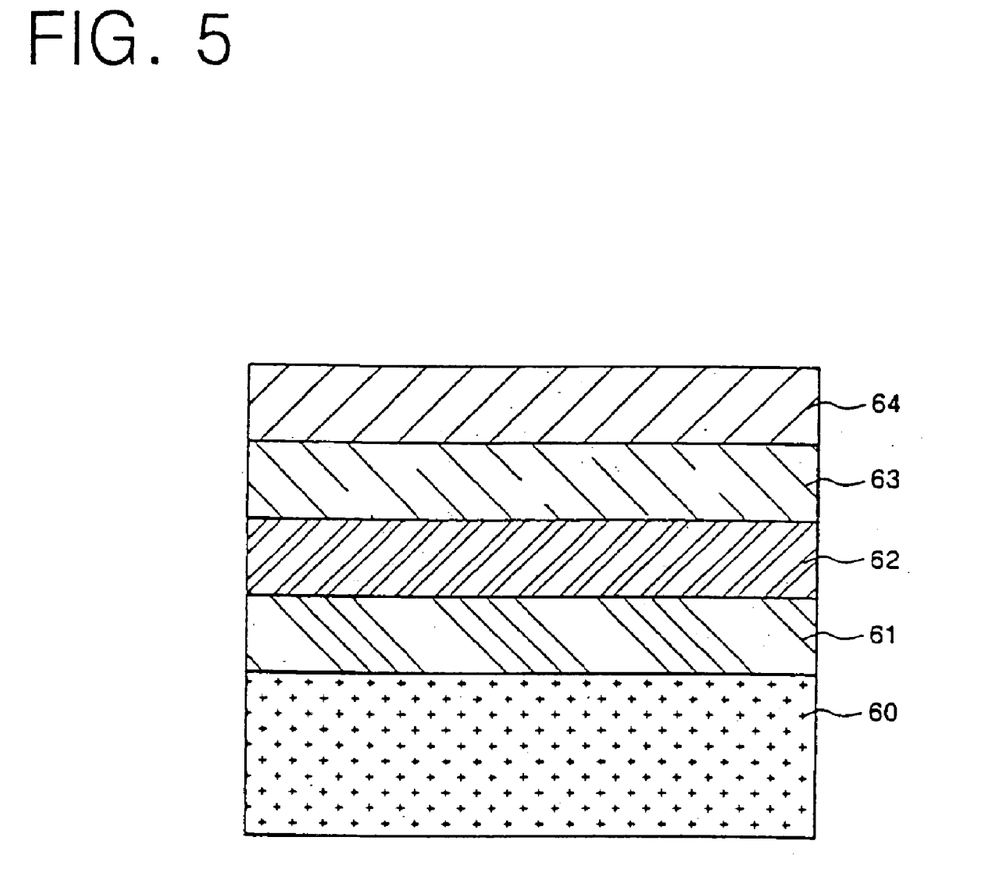
FIG. 5 is a cross-sectional schematic view illustrating a resistor pattern according to other embodiments of the present invention.

FIG. 5 is a cross-sectional schematic view illustrating a resistor pattern according to other embodiments of the present invention. As shown in FIG. 5, a low resistive layer 61, a TiN layer 62, an insulating layer 63 and a high resistive layer 64 are sequentially formed on an integrated circuit substrate 60. The low resistive layer 61, the insulating layer 63, and the high resistive layer 64 are substantially identical to the corresponding elements described previously with reference to FIG. 2 and will not be further described herein. The TiN layer 62 may be used to improve an adhesive force between the low resistive layer 61 and the insulating layer 63.

A process of forming a metal contact of a semiconductor memory device having a resistor pattern, as described with reference to FIGS. 2 and 5, according to embodiments of the present invention will now be described with reference to FIGS. 3A to 3D. FIGS. 3A to 3D are cross-sectional schematic views illustrating an integrated circuit device at various stages of the manufacturing process. As shown in FIG. 3A, an integrated circuit substrate 30 is provided. The integrated circuit substrate 30 includes a cell region 30a and a periphery region 30b. The cell region 30a includes a first cell region 30a1 and a second cell region 30a2. A capacitor is formed on the first cell region 30a1, and a junction region 31 (such as a source and/or drain region) is formed on the second cell region 30a2.

An under layer 32 is formed on the entire surface of the integrated substrate 30 as illustrated in FIG. 3A. An interlayer insulating layer or a planarization layer can be used as the under layer 32. A low resistive layer 33-1, an insulating layer 34-1, and a high resistive layer 35-1 are sequentially formed on a portion of the under layer 32 corresponding to the first cell region 30a1. The low resistive layer 33-1 in the first cell region 30a1 may be, for example, an upper capacitor electrode. While not described herein, it will be understood that a lower capacitor electrode and a dielectric layer may be formed under the low resistive layer 33-1 upper capacitor electrode to define the capacitor.

A resistor pattern R is formed on a portion of the under layer 32 over the periphery region 30b of the integrated circuit substrate 30. As shown in FIG. 3A, the resistor pattern R includes a low resistive layer 33-2, an insulating layer 34-2, and a high resistive layer 35-2, which are sequentially stacked.

The high resistive layers 35-1 and 35-2 may be made of a material having a specific resistance of hundreds to thousands of $\mu\Omega$•cm such as a doped polysilicon. In various embodiments of the present invention, the high resistive layers 35-1 and 35-2 are made of a material having a specific resistance of at least one hundred or at least one thousand $\mu\Omega$•cm. The low resistive layers 33-1 and 33-2 may be made of a low resistive material having a specific resistance of several to hundreds of $\mu\Omega$•cm, and, preferably less than one hundred $\mu\Omega$•cm. Examples of suitable materials for the low resistive layers include ruthenium (Ru), platinum (Pt), ruthenium oxide ($RuO_2$), iridium (Ir), iridium oxide ($IrO_2$), tungsten (W), aluminum (Al), copper (Cu), titanium nitride (TiN), tantalum nitride (TaN) and/or tungsten nitride (WN). The insulating layers 34-1 and 34-2 may be made of an insulating material, such as $SiO_2$, $Ta_2O_5$, $Al_2O_3$, or $Si_3N_4$. The low resistive layers 33-1 and 33-2, the insulating layers 34-1 and 34-2 and the high resistive layers 35-1 and 35-2 can have a single- or a multi-layered structure. Furthermore, the low resistive layer 33-1, the insulating layer 34-1 and the high resistive layer 35-1 formed over the first cell region 30a1 and the low resistive layer 33-2, the insulating layer 34-2 and the high resistive layer 35-2 formed over the periphery region 30b may be concurrently formed through a single photolithography process, whereby an additional mask is not required. A planarization layer 36 made, for example, of an oxide layer, may be formed over the whole surface of the integrated circuit substrate 30 in the cell region and the periphery region.

Figure 3B:
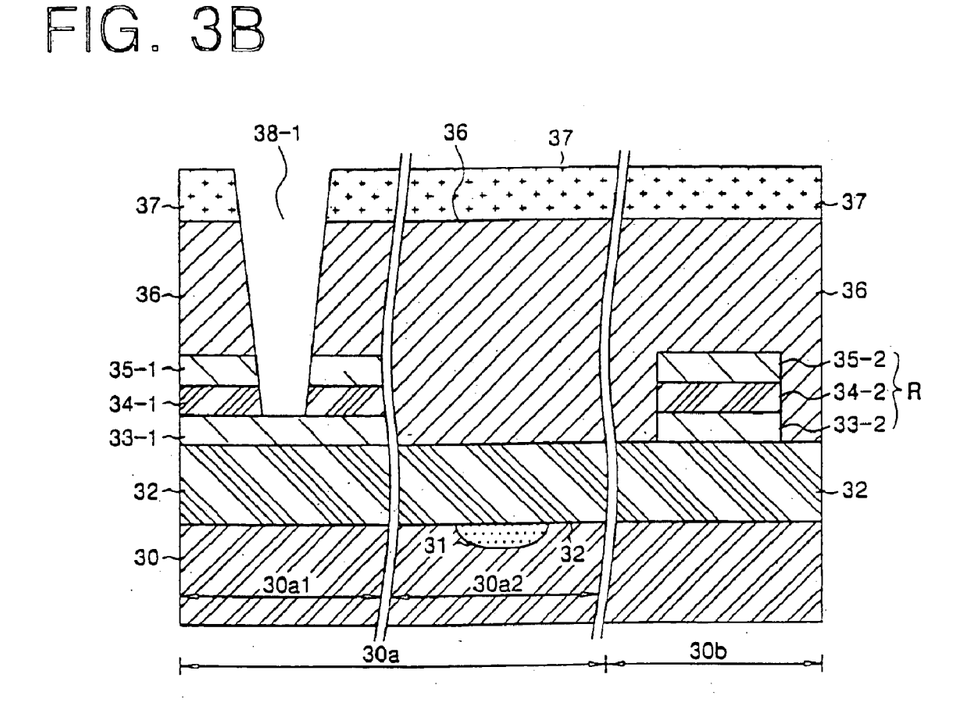

Referring now to FIG. 3B, a first mask 37 is arranged on the planarization layer 36. The first mask 37 includes an opening portion exposing a portion of the planarization layer 36 over the first cell region 30a1. A portion of the planarization layer 36, a portion of the insulating layer 34-1 and a portion of the high resistive layer 35-1 corresponding to the opening portion of the first mask 37 are concurrently etched using the first mask 37 to form a metal contact hole 38-1. The metal contact hole 38-1 exposes a portion of the low resistive layer defining the upper capacitor electrode 33-1 and may then be filled with a metal to form a metal contact to the upper capacitor electrode 33-1. The first mask 37 may then be removed.

Figure 3C:
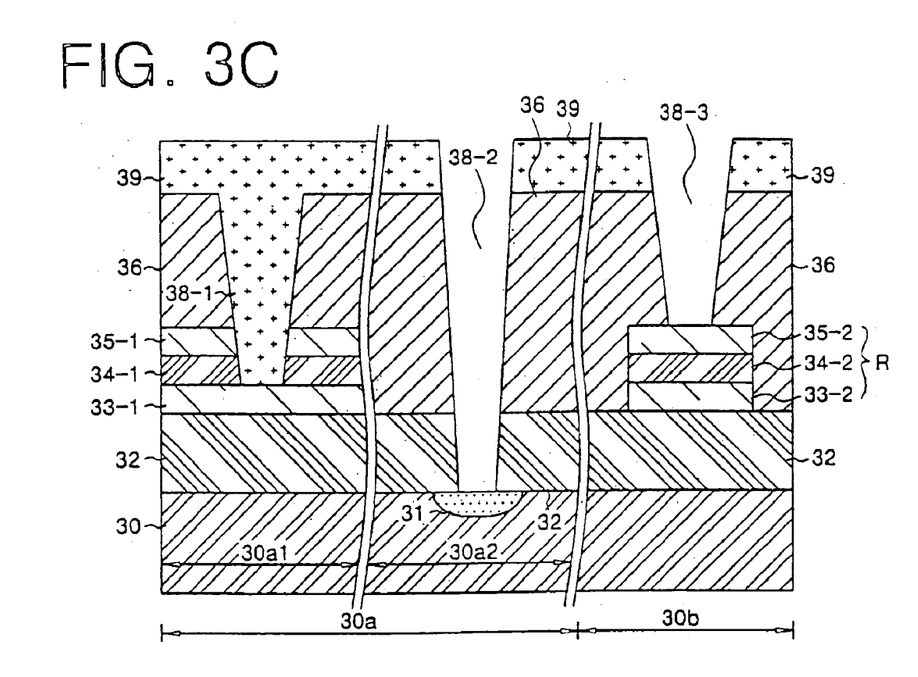
Figure 3D:
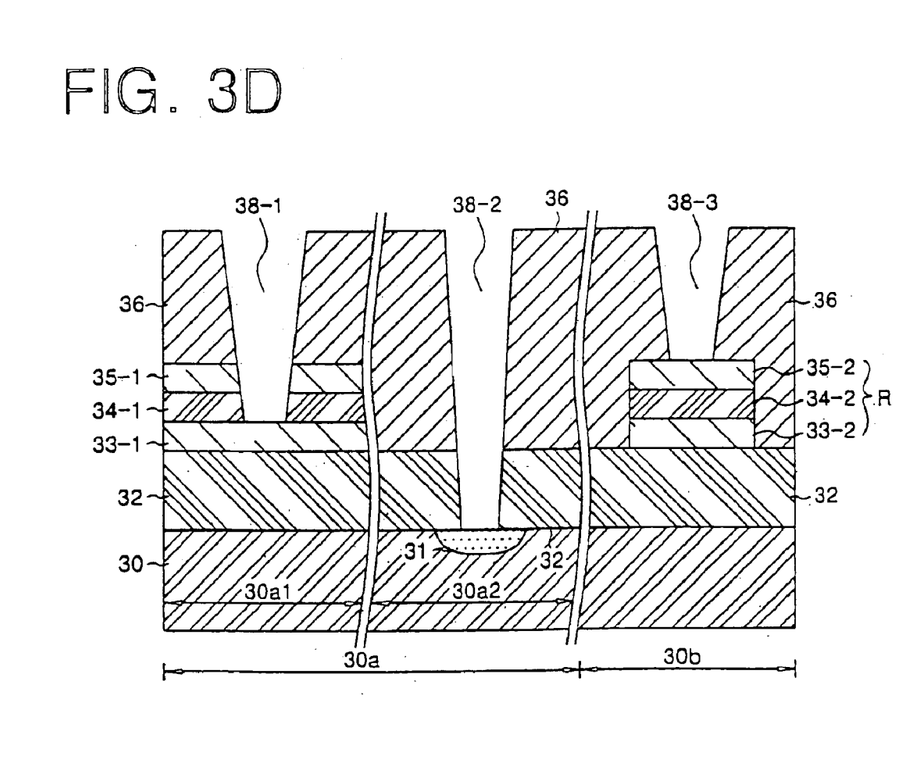

As shown in FIG. 3C, a second mask 39 is subsequently arranged on the planarization layer 36. The second mask 39 includes opening portions exposing portions of the planarization layer 36 over the second cell region 30a2 and the periphery region 30b. A portion of the under layer 32 and a portion of the planarization layer 36 over the second cell region 30a2 and a portion of the planarization layer 36 on the high resistive layer 35-2 are etched to form metal contact holes 38-2 and 38-3, respectively. As a result, the metal contact holes 38-2 and 38-3, each having a different depth, may be formed by etching the under layer 32 and the planarization layer 36 using an etching process having a selectivity against the polysilicon layer 35-2 to provide less depth to the metal contact deposited in the metal contact hole 38-3. Therefore, the process may be carried out for metal contacts formed in both of these metal contact holes without requiring an additional photo mask process. The metal contact hole 38-2 exposes a portion of the junction region 31 and the metal contact hole 38-3 exposes a portion of the high resistive layer 35-2 of the resistor pattern R. Thereafter, the second mask 39 may be removed as shown in FIG. 3D.

As described above, the upper capacitor electrode 33-1 and the resistor pattern R may be concurrently or simultaneously formed using a single mask without an additional mask. The upper capacitor electrode 33-1, the junction region 31 and the high resistive layer 35-2 may also be separately connected to a metal line that may be formed in subsequent process, not described herein, through corresponding metal contacts in the metal contact holes 38-1 to 38-3. As a result, operation of the capacitor can be provided while, at the same time, the resistor pattern R can provide a desired, relatively high resistance value, based substantially on the specific resistance of the high resistive layer 35-2 despite the presence of the low resistive layer 33-2. Furthermore, even though the insulating layer is interposed between the high resistive layer and the low resistive layer; the method of forming a metal contact according to the embodiments of the present invention described above may be performed using two photo mask processes.

Figure 4A:
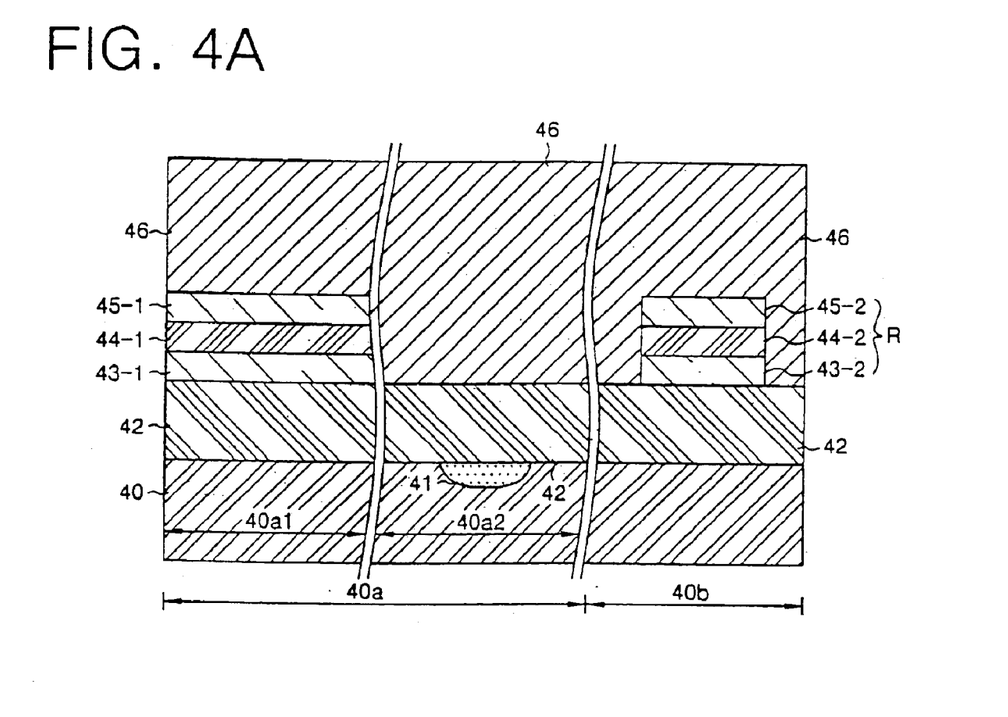
FIGS. 4A to 4D are cross-sectional schematic views illustrating methods for forming a metal contact of an integrated circuit memory device having a resistor pattern according to other embodiments of the present invention.

A process of forming a metal contact of a semiconductor memory device having a resistor pattern, as described with reference to FIGS. 2 and 5, according to further embodiments of the present invention will now be described with reference to FIGS. 4A to 4D. FIGS. 4A to 4D are cross-sectional schematic views illustrating an integrated circuit device at various stages of the manufacturing process. As shown in FIG. 4A, an integrated circuit substrate 40 is provided. The integrated circuit substrate 40 includes a cell region 40a and a periphery region 40b. The cell region 40a includes a first cell region 40a1 and a second cell region 40a2. A capacitor is formed on the first cell region 40a1, and a junction region 41 (such as a source and/or drain region) is formed on the second cell region 40a2.

An under layer 42 is formed on the entire surface of the semiconductor substrate 40. An interlayer insulating layer or a planarization layer can be used as the under layer 42. A low resistive layer 43-1, an insulating layer 44-1, and a high resistive layer 45-1 are sequentially formed on a portion of the under layer 42 corresponding to the first cell region 40a1. The low resistive layer 43-1 in the first cell region 40a1 may be used as an upper capacitor electrode and, while not described herein, it will be understood that a lower capacitor electrode and a dielectric layer are, in such a case, formed under the low resistive layer 43-1 defining the upper capacitor electrode.

A resistor pattern R is formed on a portion of the under layer 42 over the periphery region 40b of the semiconductor substrate 40. The resistor pattern R includes a low resistive layer 43-2, an insulating layer 44-2, and a high resistive layer 45-2 which are sequentially stacked. Each of the materials in the layers 43, 44, 45 may be as described for the correspondingly numbered layers 33, 34, 35 described with reference to FIGS. 3A–3D and will not be further described herein.

The low resistive layer 43-1, the insulating layers 44-1 and the high resistive layers 45-1 formed over the first cell region 40a1 and the low resistive layer 43-2, the insulating layers 44-2 and the high resistive layers 45-2 formed over the periphery region 40b may be concurrently (or even simultaneously) formed through a single photolithography process, whereby an additional mask is not required. A planarization layer 46, for example, made of an oxide layer, may be formed over the whole surface of the integrated circuit substrate 40.

Figure 4B:
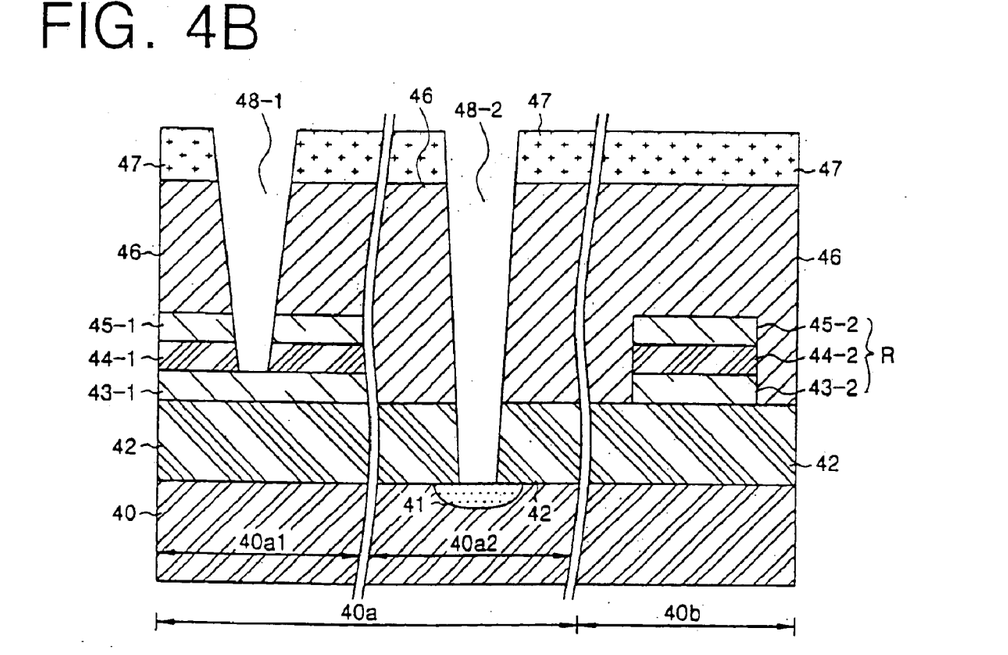

Subsequently, as shown in FIG. 4B, a first mask 47 is arranged on the planarization layer 46. The first mask 47 includes opening portions exposing portions of the planarization layer 46 over the first and second cell regions 40a1 and 40a2. A portion of the planarization layer 46, a portion of the insulating layer 44-1 and a portion of the high resistive layer 45-1 corresponding to the opening portion of the first mask 47 over the first cell region 40a1, and a portion of the planarization layer 46 and a portion of the under layer corresponding to the opening portion of the first mask 47 over the second cell region 40a2 are concurrently etched using the first mask 47 to form the metal contact holes 48-1 and 48-2 in which metal may be deposited to form corresponding metal contacts. The first mask 47 may then be removed.

To allow different depths for the metal contacts formed in the metal contact holes 48-1 and 48-2, the portions of the planarization layer 46 over the first and second cell regions 40a1 and 40a2 may be etched, and, then, the high resistive layer 45-1 may be etched using an etching gas for a polysilicon layer. The insulating layer 44-1 may then be etched using an etching gas for an oxide layer. Finally, the portion of the under layer 42 and the remaining portion of the planarization layer 46 over the second cell region 40a2 may be etched to different depths using an etching selected based on the material of the low resistive layer 43-1 to provide less depth for the metal contact in the metal contact hole 48-1. As a result, the metal contact holes 48-1 and 48-2 are formed at the same time to different depths without requiring an additional photo mask process. The metal contact hole 48-1 exposes a portion of the low resistive layer or upper capacitor electrode 43-1. The metal contact hole 48-2 exposes a portion of the junction region 41.

Figure 4C:
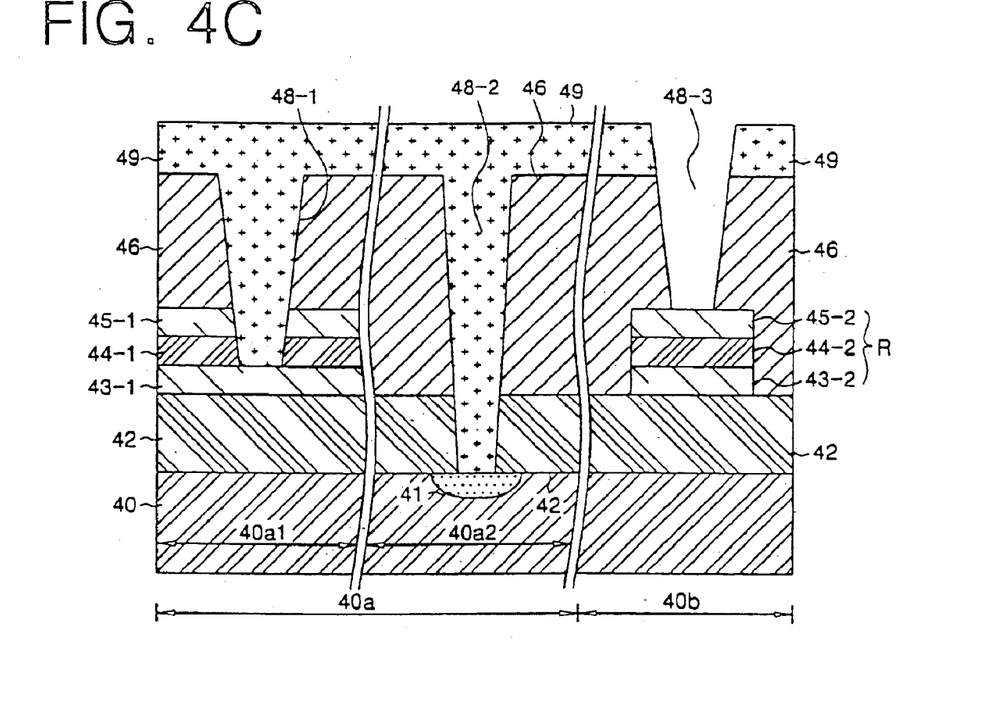
Figure 4D:
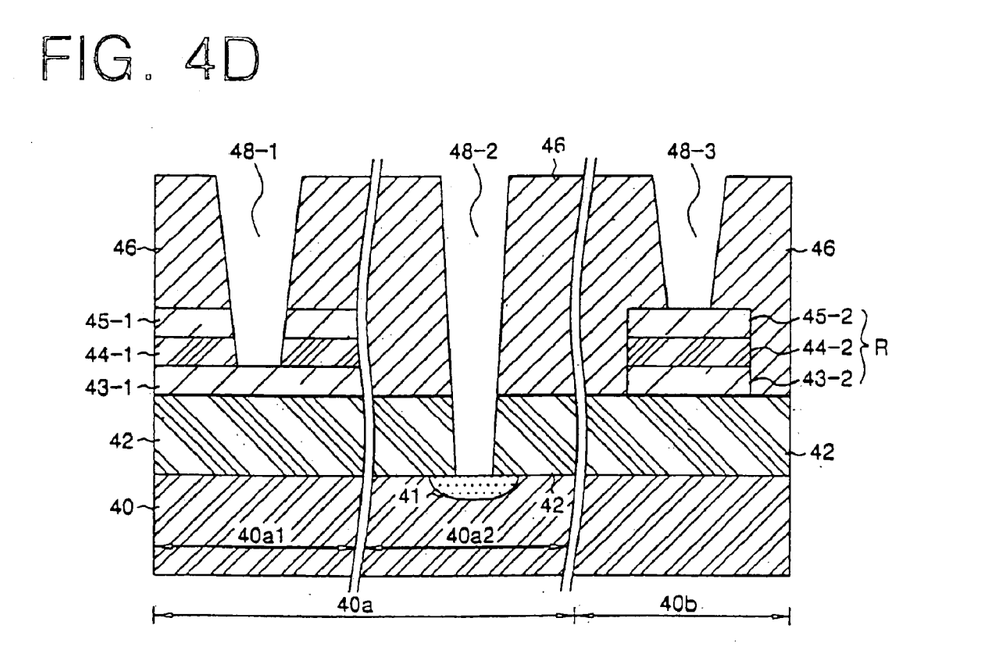

As shown in FIG. 4C, a second mask 49 is arranged on the planarization 46. The second mask 49 includes an opening portion exposing a portion of the planarization over the peripheral region 40b. A portion of the planarization layer 46 over the high resistive layer 35-2 is etched to form the metal contact hole 48-3, whereby the metal contact-hole 48-3 exposes a portion of the high resistive layer 45-2. of the resistor pattern R. The second mask 49 may then be removed as shown in FIG. 4D.

As described above, the upper capacitor electrode 43-1 and the resistor pattern R may be concurrently or simultaneously formed using a single mask without requiring an additional mask.

The upper capacitor electrode 43-1, the junction region 41 and the high resistive layer 45-2 may be separately connected to a metal line formed in subsequent process through the corresponding metal contacts formed in the metal contact holes 48-1 to 48-3. Thus, as described with reference to the embodiments of FIGS. 3A–3D and 4A–4D, operation of the capacitor can be provided while, at the same time, the resistor pattern R can be provided a desired, relatively high resistance value, based substantially on the specific resistance of the high resistive layer 35-2, 45-2 despite the presence of the low resistive layer 33-2, 43-2. Furthermore, even though the insulating layer is interposed between the high resistive layer and the low resistive layer, the method of forming the metal contact according to the embodiments of the present invention described above may be performed using two photo mask processes.

While described with reference to a particular integrated circuit device structure in FIGS. 3A–3D and 4A–4D, it is to be understood that the present invention may be applied to other structures as well. For example, instead of the junction regions 31 and 41, a conductive layer, such as a bit line or a word line, could be formed on the second cell region 30a2 and 40a2. In such embodiments, the metal contact can be formed without an additional mask process.

As described above, the present invention may provide a resistor pattern that includes an insulating layer sandwiched between the high resistive layer and the low resistive layer (or upper capacitor electrode material layer). Such a structure may provide a high resistance value based on the specific resistance of the high resistive layer despite the presence of the low resistive layer adjacent thereto. Furthermore, even though the insulating layer is interposed between the high resistive layer and the low resistive layer, an additional photolithography process need not be used in forming the resistor pattern. Furthermore, metal contacts having different depth can be formed for the integrated circuit device without requiring an additional mask process.

It should be noted that many variations and modifications can be made to the embodiments described above without substantially departing from the principles of the present invention. All such variations and modifications are intended to be included herein within the scope of the present invention, as set forth in the following claims.

We claim:

1. A resistor pattern for an integrated circuit memory device having a capacitor, comprising:
   an integrated circuit substrate;
   a low resistive layer formed on the integrated circuit substrate, the low resistive layer defining an upper capacitor electrode of the capacitor and defining a low resistive layer of the resistor pattern in a region of the integrated circuit substrate displaced from the upper capacitor electrode;
   an insulating layer formed on the upper capacitor electrode and the low resistive layer of the resistor pattern; and
   a high resistive layer formed on the insulating layer, wherein the low resistive layer, the insulating layer and the high resistive layer together define the resistor pattern in the region of the integrated circuit substrate displaced from the upper capacitor electrode.

2. The resistor pattern of claim 1 wherein the insulating layer comprises at least one of $SiO_2$, $Ta_2O_5$, $Al_2O_3$, and/or $Si_3N_4$.

3. The resistor pattern of claim 1 further comprising, a TiN layer formed between the low resistive layer and the insulating layer.

4. The resistor pattern of claim 1 wherein the low resistive layer comprises a material having a specific resistance of less than about one hundred $\mu\Omega$cm.

5. The resistor pattern of claim 4 wherein the low resistive layer comprises at least one of Ru, Pt, $RuO_2$, Ir, $IrO_2$, W, Al, Cu, TiN, TaN, and/or WN.

6. The resistor pattern of claim 1 wherein the high resistive layer has a specific resistance of at least one hundred $\mu\Omega$cm.

7. The resistor pattern of claim 6 wherein the high resistive layer has a specific resistance of at least one thousand $\mu\Omega$cm.

8. The resistor pattern of claim 6 wherein the high resistive layer comprises a doped polysilicon layer.

9. An integrated circuit device, comprising:
   a low resistive layer on an integrated circuit substrate having a first portion defining an upper electrode of a capacitor of the integrated circuit device and a second portion, separated from the first portion, in a region of the integrated circuit device displaced from the upper electrode;
   an insulating layer on the low resistive layer opposite the integrated circuit substrate; and
   a high resistive layer, having a specific resistance higher than the low resistive layer and of at least about one hundred $\mu\Omega$cm, on the insulating layer opposite the low resistive layer, wherein the second portion of the low resistive layer and the insulating layer and the high resistive layer on the second portion of the low resistive layer define the resistor pattern in the region of the integrated circuit substrate displaced from the upper electrode.

10. The device of claim 9 wherein the integrated circuit device is an integrated circuit memory device including the capacitor and wherein the second portion of the low resistive layer defining the resistor pattern and the upper capacitor electrode are formed of the same material.

11. The device of claim 10 wherein the low resistive layer comprises at least one of ruthenium (Ru), platinum (Pt), ruthenium oxide ($RuO_2$), iridium (Ir), iridium oxide ($IrO_2$), tungsten (W), aluminum (Al), copper (Cu), titanium nitride (TiN), tantalum nitride (TaN) and/or tungsten nitride (WN) and wherein the high resistive layer comprises a doped polysilicon.

12. The device of claim 11 wherein the insulating layer comprises at least one of $SiO_2$, $Ta_2O_5$, $Al_2O_3$ and/or $Si_3N_4$.

13. The device of claim 10 further comprising at least one of a source and/or a drain in a cell region of the integrated circuit memory device between the the resistor pattern and the capacitor.

14. The device of claim 10 further comprising:

a first metal contact extending to the upper capacitor electrode; and a second metal contact, having a depth different from a depth of the first metal contact, extending to the high resistive layer of the resistor pattern.

15. The device of claim 10 further comprising a titanium nitride (TiN) layer between the low resistive layer and the insulating layer.

* * * * *